United States Patent
Davidson et al.

(10) Patent No.: US 9,076,618 B2
(45) Date of Patent: Jul. 7, 2015

(54) NANOTUBE BASED NANOELECTROMECHANICAL DEVICE

(71) Applicant: Elwha LLC, Bellevue, WA (US)

(72) Inventors: Howard L. Davidson, San Carlos, CA (US); Roderick A. Hyde, Redmond, WA (US); Jordin T. Kare, Seattle, WA (US); Richard T. Lord, Gig Harbor, WA (US); Robert W. Lord, Seattle, WA (US); Nathan P. Myhrvold, Medina, WA (US); Clarence T. Tegreene, Mercer Island, WA (US); Charles Whitmer, North Bend, WA (US); Lowell L. Wood, Jr., Bellevue, WA (US)

(73) Assignee: ELWHA LLC, Bellevue, WA (US)

( * ) Notice: Subject to any disclaimer, the term of this patent is extended or adjusted under 35 U.S.C. 154(b) by 0 days.

(21) Appl. No.: 14/101,683

(22) Filed: Dec. 10, 2013

(65) Prior Publication Data

US 2015/0162156 A1    Jun. 11, 2015

Related U.S. Application Data

(63) Continuation of application No. 13/398,551, filed on Feb. 16, 2012, now Pat. No. 8,693,242.

(51) Int. Cl.
*G11C 11/50* (2006.01)
*H01H 59/00* (2006.01)
*H01H 1/00* (2006.01)
*B82Y 99/00* (2011.01)

(52) U.S. Cl.
CPC .......... *H01H 59/0009* (2013.01); *H01H 1/0094* (2013.01); *G11C 11/50* (2013.01); *Y10S 977/742* (2013.01); *Y10S 977/932* (2013.01); *B82Y 99/00* (2013.01)

(58) Field of Classification Search
USPC .................. 365/164, 151; 977/732, 742, 943
See application file for complete search history.

(56) References Cited

U.S. PATENT DOCUMENTS

| | | | |
|---|---|---|---|
| 7,095,645 B2 * | 8/2006 | Pinkerton et al. | 365/151 |
| 7,256,063 B2 * | 8/2007 | Pinkerton et al. | 438/53 |
| 7,279,760 B2 | 10/2007 | Viefers et al. | |
| 7,446,044 B2 | 11/2008 | Kaul et al. | |
| 7,573,739 B2 | 8/2009 | Yun et al. | |
| 7,791,936 B2 | 9/2010 | Lee et al. | |
| 8,693,242 B2 * | 4/2014 | Davidson et al. | 365/164 |
| 2007/0138705 A1 | 6/2007 | Mickelson et al. | |

* cited by examiner

*Primary Examiner* — Toan Le
(74) *Attorney, Agent, or Firm* — Foley & Lardner LLP

(57) ABSTRACT

A nanoelectromechanical device is provided. The nanoelectromechanical device includes a nanotube, a first contact, and a first actuator. The nanotube includes a first end, the first end supported by a first structure, a second end opposite the first end, and a first portion. The first actuator is configured to apply a first force to the nanotube, the first force causing the nanotube to buckle such that the first portion couples to the first contact.

34 Claims, 10 Drawing Sheets

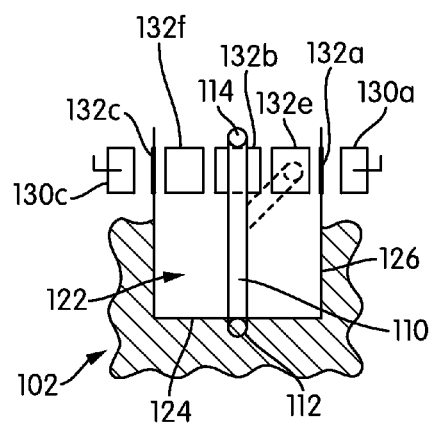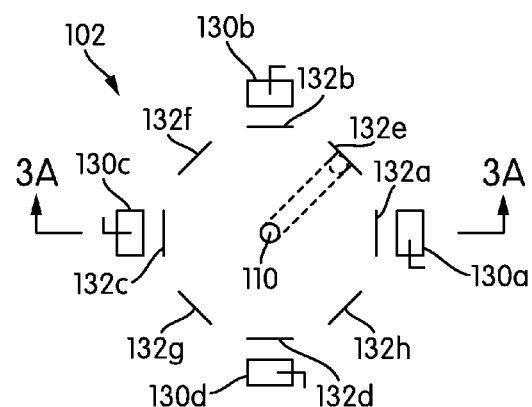
FIG. 3A
FIG. 3B
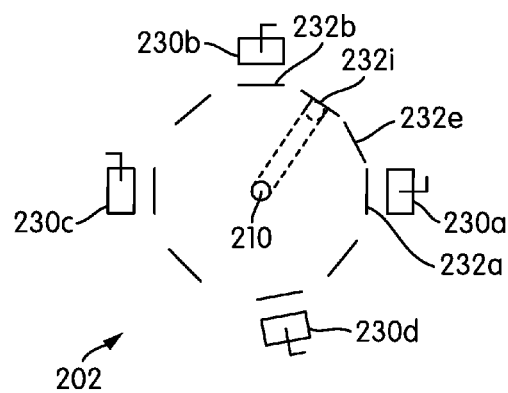
FIG. 4

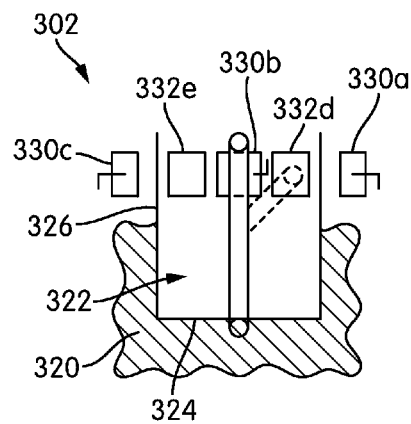
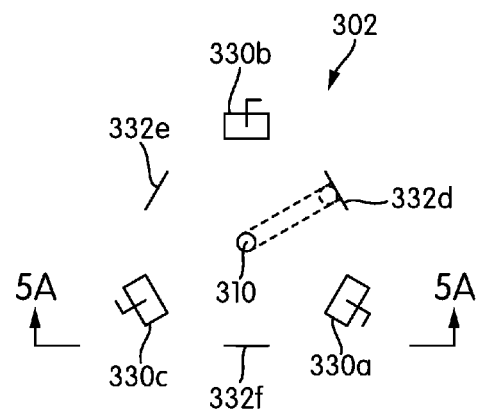
FIG. 5A        FIG. 5B
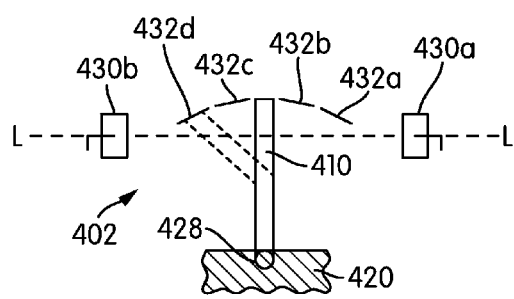
FIG. 6

NANOTUBE BASED NANOELECTROMECHANICAL DEVICE

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

The present application constitutes a continuation of U.S. patent application Ser. No. 13/398,551, entitled NANOTUBE BASED NANOELECTROMECHANICAL DEVICE, naming Howard L. Davidson, Roderick A. Hyde, Jordin T. Kare, Richard T. Lord, Robert W. Lord, Nathan P. Myhrvold, Clarence T. Tegreene, Charles Whitmer, Lowell L. Wood, Jr. as inventors, filed 16 Feb. 2012, which is currently co-pending and is herein incorporated by reference in its entirety.

RELATED APPLICATIONS

None.

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

BACKGROUND

The present application relates generally to the field of nanoelectromechanical devices. More specifically, the present disclosure relates to the field of using a nanotube to complete a circuit. Even more specifically, the present disclosure relates to the field of multi-state nanotube memory.

Nanotechnology is a rapidly developing field, which includes the development of nanostructures (e.g., nanotubes, fullerines, nanostrips, etc.) and nanoelectromechanical systems (NEMS) and devices. The small scale of nanotechnology makes it an ideal match for electronics systems. For example, NEMS may be used in integrated circuits, switches, and memory applications.

Conventional electronic switches and memory locations have binary states, which provide $2^n$ possible combinations (n being the number of memory locations). Increasing the number of possible states increases the possible combinations to $x^n$ (x being the number of states). This allows a much higher density of switching functions or memory data, leading to smaller and more compact designs.

SUMMARY

One embodiment relates to a nanoelectromechanical device. The nanoelectromechanical device includes a nanotube, a first contact, and a first actuator. The nanotube includes a first end, the first end supported by a first structure, a second end opposite the first end, and a first portion. The first actuator is configured to apply a first force to the nanotube, the first force causing the nanotube to buckle such that the first portion couples to the first contact.

Another embodiment relates to a nanoelectromechanical device having a nanotube, a plurality of contacts comprising a first contact and a second contact, a first electrode configured to apply a first force to the nanotube, the first force acting in a first direction, and a second electrode configured to apply a second force to the nanotube, the second force acting in a second direction. The nanotube includes a first end, the first end supported by a first structure, a second end opposite the first end, and a first portion. The first portion is configured to couple to one of the plurality of contacts depending on the ratio of the first force and the second force applied to the nanotube.

Another embodiment relates to a nanoelectromechanical device including a nanotube extending from a first structure along an axis, the nanotube including a first end supported by the first structure and a second end opposite the first end. The nanoelectromechanical device further includes a plurality of contacts comprising a first contact and a second contact, a first actuator configured to rotate the nanotube about the axis and to align the nanotube with one of the plurality of contacts, and a second actuator configured to deflect the nanotube such that the nanotube couples to the one of the plurality of contacts.

Another embodiment relates to a nanoelectromechanical device including a nanotube having a first end supported by a first structure, a second end opposite the first end, a buckling location located between the first end and the second end, a first segment extending from the first end to the buckling location along a first axis, and a second segment extending from the buckling location to the second end. The nanoelectromechanical device further includes a plurality of contacts comprising a first contact and a second contact and a first actuator configured to rotate the nanotube about the axis and to align the nanotube with one of the plurality of contacts.

Another embodiment relates to a nanoelectromechanical device including a nanotube having a first end supported by a first structure and a second end opposite the first end and supported by a second structure. The nanoelectromechanical device further includes a plurality of contacts located between the first structure and the second structure, a first electrode configured to apply a first force to the nanotube, the first force causing the nanotube to buckle such that a first portion of the nanotube couples to a first contact, and a second electrode configured to apply a second force to the nanotube, the second force causing the nanotube to buckle such that a second portion of the nanotube couples to a second contact.

Another embodiment relates to a nanoelectromechanical device including a nanotube having a first end supported by a first structure and a second end disposed opposite the first end; a plurality of contacts spaced along the length of a surface; and a first actuator configured to apply a variable force to the nanotube, the variable force causing the nanotube to couple to the surface along a variable length, thereby coupling the nanotube to at least one of the plurality of contacts.

Another embodiment relates to a memory device including a nanotube having a first end supported by a first structure and a second end opposite the first end. The memory device further includes a first memory state, a second memory state in which the nanotube is elastically deformed, and a third memory state in which the nanotube is buckled.

Another embodiment relates to a method of closing an electrical circuit. The method includes providing a nanotube, providing a plurality of contacts, and causing the nanotube to buckle such that a portion of the nanotube couples to one of the plurality of contacts.

The foregoing is a summary and thus by necessity contains simplifications, generalizations and omissions of detail. Consequently, those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

FIGS. 3A-3B are schematic diagrams of a nanoelectromechanical device, shown according to another embodiment.

FIG. 4 is a schematic diagram of a nanoelectromechanical device, shown according to another embodiment.

FIGS. 5A-5B are schematic diagrams of a nanoelectromechanical device, shown according to another embodiment FIG. 6 is a schematic diagram of a nanoelectromechanical device, shown according to another embodiment.

DETAILED DESCRIPTION

Figure 1:
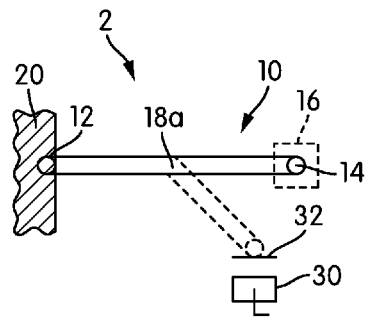
FIG. 1 is a schematic diagram of a nanoelectromechanical device, shown according to an exemplary embodiment.

Referring generally to the figures, a nanoelectromechanical device and components thereof are shown according to exemplary embodiments. The device generally includes a nanostructure (e.g., nanotube, nanostrip, fullerene, etc) and one or more support structures (e.g., substrate). An actuator (e.g., an electrostatic electrode, piezoelectric actuator, a magnetostriction actuator, etc.) may be used to deflect the nanotube towards a contact. Whether the actuator pulls or pushes the nanotube may depend on the charge of the actuator relative to the charge on the nanotube, for example, in the case of an electrostatic electrode. According to various embodiments, the actuator may cause the nanotube to elastically deform or to buckle. Elastic deformation generally has a linear force versus deflection curve; however, when the nanostructure buckles, it has a non-linear force versus deflection curve. Buckling may be induced in the nanotube by exerting one or more forces on the nanotube. Buckling may further be induced or encouraged at a desired location based on the location and direction of the force exerted upon the nanotube or as a result of stress concentrators (e.g., stress riser, stress maximizer, etc.) acting on the nanotube. For example, defects (e.g., holes, extra atoms, etc.) may be formed in the nanotube structure at desired locations, thereby creating a weak point that is susceptible to buckling. Mechanical stress concentrators (e.g., a sharp edge proximate the nanotube), may encourage or induce buckling in a particular location. Thus, buckling provides more control over the nanotube, and enables the nanotube to be moved into more configurations than just bending alone. Various combinations of actuators and contacts may be configured to form switches or memory (e.g., volatile memory, non-volatile memory, random access memory (RAM), read only memory (ROM), programmable read only memory (PROM), erasable programmable read only memory (EPROM), etc.). For example, the nanotubes may be used to form single pole multiple throw switches or multi-state memory depending on the number of contacts.

The described nanoelectromechanical device described herein has benefits which may be particularly useful in radiation sensitive environments, for example, satellites, earth-orbiting satellites, sensor technology, etc. Typical radiation shielding for integrated circuits uses ceramic packaging. The devices described herein may provide a lower-cost, lower-weight approach to radiation shielding, while providing comparable performance and reliability to traditional charge-storage memory having radiation shielding. Other useful applications include low intermodulation distortion radio frequency mixers and low level radio frequency switches.

For purposes of this disclosure, the term coupled means the joining of two members directly or indirectly to one another. Such joining may be stationary in nature or moveable in nature and/or such joining may allow for the flow of fluids, electricity, electrical signals, or other types of signals or communication between the two members. Such joining may be achieved with the two members or the two members and any additional intermediate members being integrally formed as a single unitary body with one another or with the two members or the two members and any additional intermediate members being attached to one another. Such joining may be permanent in nature or alternatively may be removable or releasable in nature. References to "upward," "downward," "behind," "inner," "outer," "right," and "left" in this description are merely used to identify the various elements as they are oriented in the figures. These terms are not meant to limit the element which they describe, as the various elements may be oriented differently in various applications.

Referring to FIG. 1, a schematic diagram of a nanoelectromechanical device 2 is shown according to an exemplary embodiment. The device 2 generally includes a nanostructure (e.g., nanotube, nanostrip, fullerene, etc), shown as nanotube 10, and one or more support structures 20 (e.g., substrate, wall, etc.). While the structure 20 is schematically shown as a simple anchoring structure, it is contemplated that in practice the structure 20 may include a plurality of layers including bit lines (e.g., right lines, word lines etc.), insulators, etc. The support structure 20 may be formed of any suitable material, for example, a silicon wafer substrate. As for the nanostructure, a nanotube is preferably used because of its substantially uniform structure and, therefore, known elastic, buckling, and failure properties. Further, the cylindrical form of nanotubes enables them to be self supporting and to be deflected in any number of directions. Nanotubes may be formed from a variety of materials including carbon, silicon, boron nitride, etc. Carbon nanotubes are preferably used because they elastically deform and buckle at controllable levels and because they can reversibly buckle in more than one direction. The nanotube 10 may be formed from any suitable method, including chemical vapor deposition. According to some embodiments, the nanotube 10 may be formed in-situ or disposed on the support structure 20 so as to extend as a cantilever. According to other embodiments, the nanotube 10 may be formed or disposed between two support structures 20a, 20b (see, for example, FIGS. 7-10). For example, the nanotube 10 may be formed across a trench 22.

An actuator 30 (e.g., an electrode, an electrostatic electrode, anode, cathode, etc.) may be used to deflect the nanotube 10 towards a contact 32. Whether the actuator 30 pulls or pushes the nanotube 10 depends on the charge of the actuator 30 relative to the charge on the nanotube 10. For example, if the actuator 30 and the nanotube 10 are both positively or negatively charged, then the actuator 30 will push or repel the nanotube 10. In contrast, if the actuator 30 and the nanotube 10 are oppositely charged, the actuator 30 will pull or attract the nanotube 10. According to various embodiments, the actuator 30 may cause the nanotube 10 to elastically deform or to buckle.

The nanotube 10 includes a first end 12 and a second end 14 located opposite or distal from the first end 12. According to the embodiment shown, the nanotube 10 is coupled to and supported by the support structure 20 at the first end 12 and cantilevers outward therefrom. The nanotube 10 further includes a portion 16 (e.g., region, section, area, etc.) configured to couple to the contact 32. Referring briefly to FIG. 2D, the portion 16 may be disposed proximate the second end 14, shown as portion 16a, or spaced apart from the first end 12 and the second end 14, shown as portion 16b. As shown, the actuator 30 may exert an attractive force on the nanotube 10 such that the nanotube 10 buckles at a first buckling location 18a, and the portion 16 couples to the contact 32 (as shown in dashed lines). According to various embodiments, coupling the portion 16 to the contact 32 may close or complete an electrical circuit or set a memory state. Depending on the formation of the nanotube 10, the buckling of the nanotube 10 may be reversible or irreversible. For example, if the nanotube 10 has a relatively small diameter, the nanotube 10 is fairly resilient and will return to the non-buckled state when the force from the actuator 30 is removed. However, if the nanotube 10 has a relatively large diameter, the buckled energy state may be lower than the non-buckled energy state, and the nanotube 10 may require an additional treatment (e.g., an electrical force, chemical immersion, heating, etc.) to return the non-buckled state. According to one embodiment, the device 2 may be configured such that the nanotube 10 is held in a closed state by stiction between the nanotube 10 and the contact 32.

Figure 2A:
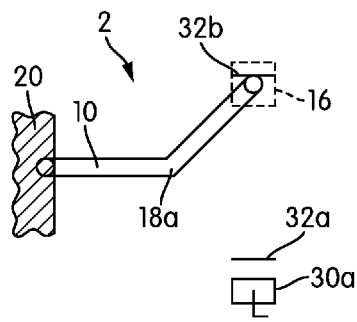
FIGS. 2A-2D are schematic diagrams of the nanoelectromechanical device of FIG. 1, shown according to various embodiments.
Figure 2B:
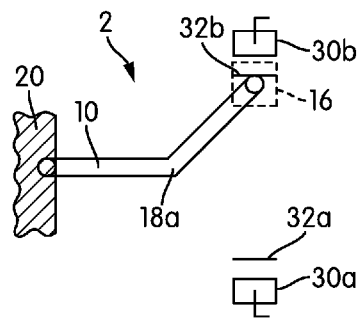
Figure 2C:
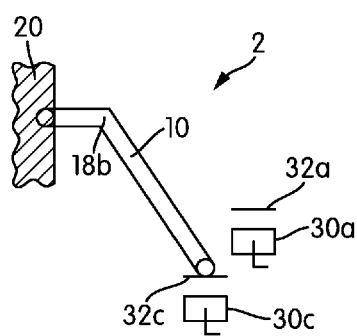
Figure 2D:
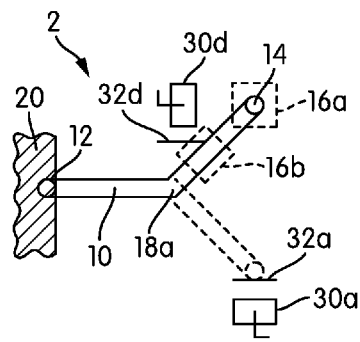

Referring to FIGS. 2A-2D, nanoelectromechanical devices 2 having additional actuators 30 and/or contacts 32 are shown according to various embodiments. The device 2 may include additional contacts 32 to form a multistate memory or multithrow switch. To couple to a second contact 32 a second force may be exerted on the nanotube 10. As shown in FIG. 2A, the actuator 30 may be configured to apply a second or repulsive force to the nanotube 10 that causes the nanotube 10 to couple to a second contact 32b. As shown in FIG. 2B, the device 2 includes a second actuator 30b, which may be configured to apply a second attractive force to the nanotube 10 that causes the nanotube 10 to couple to the second contact 32b.

When coupling to different contacts 32, the nanotube 10 may buckle in different directions or different locations. As shown in FIGS. 2A, 2B, and 2D, the nanotube 10 may buckle at the same buckling location 18a, but in a different direction that the first contact 32a. As shown in FIG. 2C, the nanotube 10 may couple to a second contact 32c by buckling in the same direction as the first contact 32a, but at a second buckling location 18b. According to other embodiments, the nanotube 10 may buckle at different locations and in different directions.

When coupling to different contacts 32, the same portion 16 of the nanotube 10 may couple to each of the contacts 32, or a different portion 16 may couple to some of the contacts 32. As shown in FIGS. 2A-2C, the same portion 16, shown as the tip of the nanotube 10, couples to each of the contacts 32. As shown in FIG. 2D, a first portion 16a couples to the first contact 32a, but a second portion 16b of the nanotube 10 couples to the second contact 32d. Coupling to different portions along the nanotube 10 may be useful or occur when different contacts 32 are disposed in different layers of a circuit board. For example, the first contact 32a may be in a first layer and the second contact 32d may be in a second layer of a circuit board.

Referring to FIGS. 3-6, various nanoelectromechanical devices 102, 202, 302, and 402 are shown according to exemplary embodiments. The devices include a plurality of actuators 130, 230, 330, 430 and a plurality of contacts 132, 232, 332, 432. As described above, the nanotube 110, 210, 310, 410 may be pushed or pulled by an actuator to couple to a contact. For example, the devices 102, 202, 302, and 402 are shown to electrostatically attract the nanotube; however, the actuators may apply a repulsive force to the nanotube as described with respect to FIG. 2A. The devices may also be configured such that two or more actuators jointly exert forces upon the nanotube such that the nanotube deflects in the direction of a resultant force, wherein the resultant force is a function of the ratio of forces acting upon the nanotube. According to various embodiments, the nanotube may deflect by elastic deformation or buckling, and the device 102, 202, 302, and 402 may be configured such that the nanotube remains coupled to a contact by stiction after the forces that caused the coupling have been removed. Briefly referring to FIGS. 7-10, while the devices 102, 202, 302, and 402 are shown as having cantilevered nanotubes, it is contemplated that a second end 114, 214, 314, 414 of the nanotube, located opposite the first end 112, 212, 312, 412 maybe supported by a second structure 120b, 220b, 320b, 420b such that the nanotube 110, 210, 310,410 forms a bridge rather than a cantilever.

Referring to FIGS. 3A and 3B, a nanoelectromechanical device 102 is shown according to an exemplary embodiment. FIG. 3A is a schematic cross-sectional elevational view of the device 102 shown in plan view in FIG. 3B. The nanotube 110 is shown disposed in a trench 122 (e.g., pit, well, etc.) such that nanotube 110 extends axially from a first end 112 coupled to the floor 124 of the trench 122. The device 102 includes a plurality of actuators 130, shown as first through fourth actuators 130a-130d, disposed in a first plurality of radial directions around the nanotube 110. As shown, the actuators 130 are evenly spaced circumferentially around the nanotube 110. Each actuator 130 is configured to apply a force on the nanotube 110 in a particular direction. For example, a first actuator 130a is configured to apply a first force to the nanotube 110, the first force acting in a first direction, the second actuator 130b configured to apply a second force to the nanotube 110, the second force acting in a second direction, and so on. The device 102 is further shown to include a plurality of contacts 132, shown as first through eighth contacts 132a-132h, disposed in a second plurality of radial directions around the nanotube 110. The contacts 132 are shown to be evenly spaced circumferentially around the nanotube.

According to the embodiment shown, when the first actuator 130a acts upon the nanotube 110, the nanotube 110 couples to the first contact 132a, and when the second actuator 130b acts upon the nanotube 110, the nanotube 110 couples to the second contact 132b. However, when two or more forces act upon the nanotube 110, the deflection of the nanotube 110 is based on the ratio of forces and the generated resultant force. For example, when the first force and the second force of the first and second actuators 130a, 130b act upon the nanotube 110, the nanotube 110 buckles in the direction of the resultant force and couples to a third contact 132e, which is disposed in a third direction from the nanotube 110. According to one embodiment, the resultant force occurs at an angle of tangent (first force/second force) with respect to the nanotube 110.

According to the exemplary embodiment shown, the plurality of contacts 132 are arranged in a ring around a vertically extending cantilevered nanotube 110, and the actuators 130 are in the form of X and Y deflection plates such that the nanotube 110 is deflected at an angle of TAN(Vy/Vx). The device 102 is further shown to include a third actuator 130c, which is configured to apply a third force to the nanotube 110, the third force causing the nanotube 110 to buckle such that the nanotube 110 couples to a fourth contact 132c. The third actuator 130c may be used in conjunction with the second actuator 130b to couple the nanotube 110 to a fifth contact 132f.

While even distribution of the contacts 132 and the actuators 130 about the nanotube 110 simplifies the control of the nanotube 110, uneven distribution of the actuators 130 and the contacts 132 is contemplated. According to various other embodiments, the device 102 may comprise more or fewer actuators 130 and contacts 132, and the actuators 130 and the contacts 132 may or may not completely circumscribe the nanotube 110.

Referring to FIG. 4, a plan view of a nanoelectromechanical device 202 is shown according to an exemplary embodiment. Like device 102, device 202 includes an axially extending nanotube 210, a plurality of contacts 232 located in a plurality of radial directions from the nanotube 210, and a plurality of actuators 230 located in a second plurality of directions from the nanotube 210. The device 202 is shown to include a third contact 232e and a fourth contact 232i between the first actuator 230a and the second actuator 230b. Accordingly, the coupling of the nanotube 210 to a desired contact 232i may be controlled by the ratio of forces exerted upon the nanotube 210 by the actuators 230a and 230b. The device 202 is further shown to include uneven distribution of the actuators 230 and the contacts 232.

Referring to FIGS. 5A and 5B, a nanoelectromechanical device 302 is shown according to an exemplary embodiment. FIG. 5A is a schematic cross-sectional elevational view of the device 302 shown in plan view in FIG. 5B. Like device 102, device 302 includes a nanotube 310 extending axially from a support structure 320, a plurality of contacts 332 located in a plurality of radial directions from the nanotube 310, and a plurality of actuators 330 located in a second plurality of directions from the nanotube 310. As shown, the plurality of contacts 332 are evenly interspaced between the plurality of actuators 330 such that none of the contacts 332 are in the same direction from the nanotube 310 as an actuator 330. In operation, the nanotube may be coupled to a desired contact 332d by controlling the ratio of forces exerted upon the nanotube 310 by a plurality of actuators 330, for example attractive forces by the first and second actuators 330a, 330b. One advantage of having all of the contacts 332 offset from the actuators 330 is that if one of a pair of actuators 330 fails to exert force on the nanotube 310, the nanotube 310 will be attracted to the other of the pair where there was no contact 332. Thus, the nanotube 310 would make no contact, rather than an errant contact. For example, in the embodiment shown, if the first actuator 330a had failed, the nanotube 310 would be drawn to the second actuator 330b, leaving the circuit open because the nanotube 310 does not couple to a contact 332.

Referring to FIG. 6, a nanoelectromechanical device 402 is shown according to an exemplary embodiment. The device 402 is shown to include a nanotube 410 extending radially from a point 428 where the nanotube 410 couples to the support structure 420; a plurality of contacts 432, shown as first through fourth contacts 432a-432d, which extend in a plurality of radial directions from the point 428; and a plurality of actuators 430, shown as right and left actuators 430a, 430b. According to one embodiment, the contacts 432 are arranged in a planar fan such that the plurality of radial directions defines a plane, that is, the contacts 432 are located in a plane. According to the embodiment shown, the actuators 430 are coplanar with the contacts 432. The nanotube 410 is shown to be in a first position extending in a first radial direction, and the first and second actuators 430a, 430b are further shown to be located along a secant line L-L that is substantially perpendicular to the first radial direction. According to the embodiment shown, the nanotube 410 is in the first position when no actuators 430 are exerting force on the nanotube 410. In operation, the nanotube 410 couples to a desired contact 432 based on the ratio of forces exerted on the nanotube 410 by the left actuator 430b and the right actuator 430a. According to various embodiments, the nanotube 410 may deflect by elastic deformation or buckling, and the device 410 may be configured such that stiction between the nanotube 410 and a contact 432 maintains a closed circuit after the coupling forces are removed.

Referring to FIGS. 7-10, various electromechanical devices 502, 602, 702, and 802 are shown according to exemplary embodiments. The devices share similar characteristics to the device as described above; however, in these devices, the nanotube is not cantilevered, but is supported at the second end to form a bridge, for example, over a trench. According to various embodiments, supporting the nanotube at the second end constrains movement of the nanotube, and may thereby reduce or eliminate the need for stiction to maintain coupling between the nanotube and the contact after the coupling forces are removed, thus facilitating design of bi-stable or multi-stable devices.

Figure 7A:
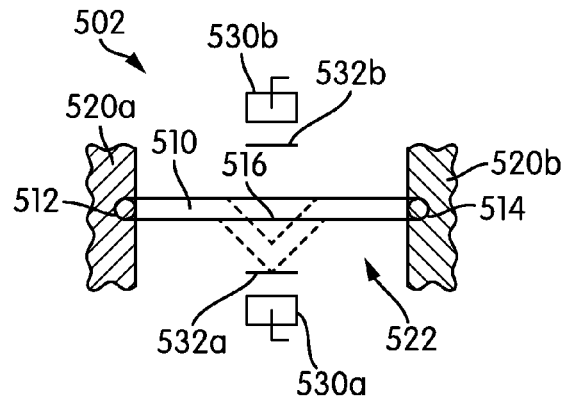
FIGS. 7A-7B are schematic diagrams of a nanoelectromechanical device, shown according to another embodiment.
Figure 7B:
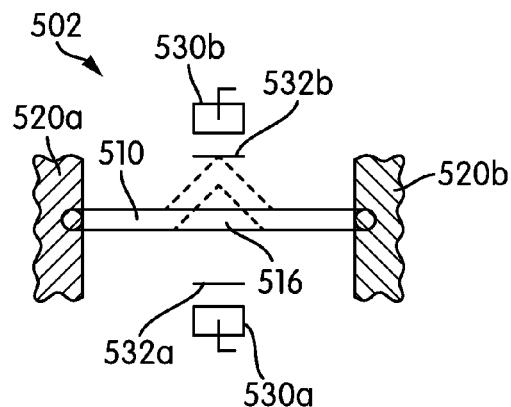

Referring specifically to FIGS. 7A and 7B, a device 502 includes a nanotube 510 having a first end 512 coupled to a first structure 520a and having a second end 514 located opposite the first end 512 and coupled to a second structure 520b. The nanotube 510 is shown to be suspended over a trench 522. The device 502 is further shown to include a first actuator 530a configured to exert a first force in a first direction on the nanotube 510 and a second actuator 530b configured to exert a second force in a second direction on the nanotube 510. As shown in FIG. 7A, when the first actuator 530a exerts the first force upon the nanotube 510, the nanotube 510 buckles in the first direction such that a portion 516 of the nanotube 510 couples to a first contact 532a. As shown in FIG. 7B, when the second actuator 530b exerts the second force upon the nanotube, the nanotube 510 buckles and a second direction such that the portion 516 of the nanotube 510 couples to a second contact 532b. Referring briefly to FIG. 2A, one embodiment of the device 502 may include an actuator 530 which is configured to push or repel the nanotube 510. Accordingly, the device 502 may only require one actuator 530 to buckle the nanotube 510 in the first direction (e.g., via attraction) and in the second direction (e.g., via repulsion).

Figure 8:
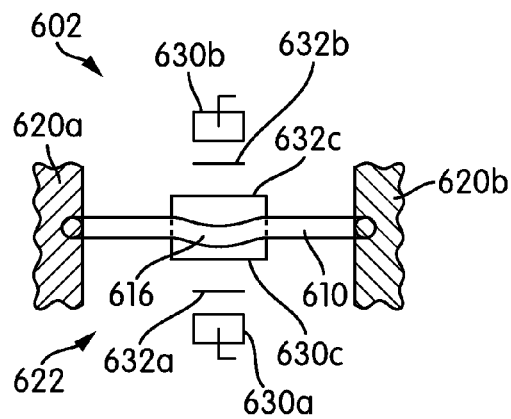
FIG. 8 is a schematic diagram of a nanoelectromechanical device, shown according to another embodiment.

Referring to FIG. 8, a device 602 includes a nanotube 610 suspended over a trench 622 between a first structure 620a and a second structure 620b. The device 602 is shown to include first through third actuators 630a, 630b, and 630c, and first through third contacts 632a, 632b, and 632c. Each of the actuators 630a, 630b, 630c is configured to exert a force on the nanotube 610 in a first, second, or third direction, respectively. As shown, the third actuator 630c (illustrated as behind, or into the page from, the nanotube 610) is exerting a force in the third direction such that the nanotube 610 buckles towards and couples to the third contact 632c. Briefly referring to FIGS. 3-5, it is contemplated that two or more of the actuators 630 may jointly exert forces upon the nanotube 610 such that the nanotube 610 deflects in a fourth direction corresponding to the direction of the resultant force, the direction of the resultant force being a function of the ratio forces exerted upon the nanotube 610 by the plurality of actuators 630.

Figure 9A:
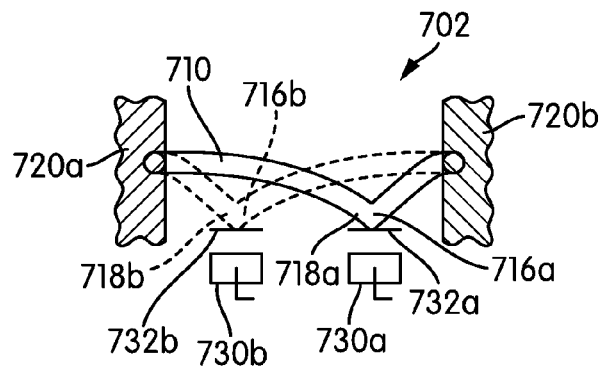
FIGS. 9A-9C are schematic diagrams of a nanoelectromechanical device, shown according to another embodiment.
Figure 9B:
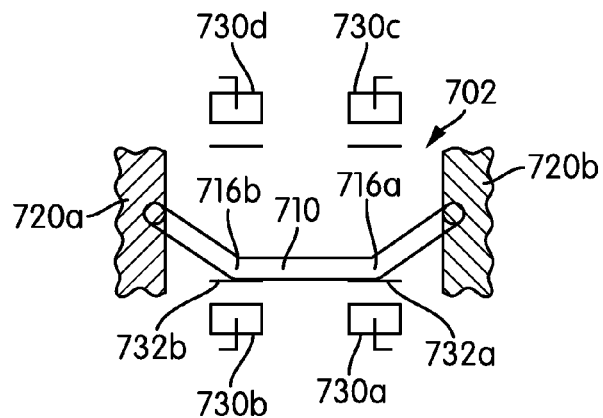
Figure 9C:
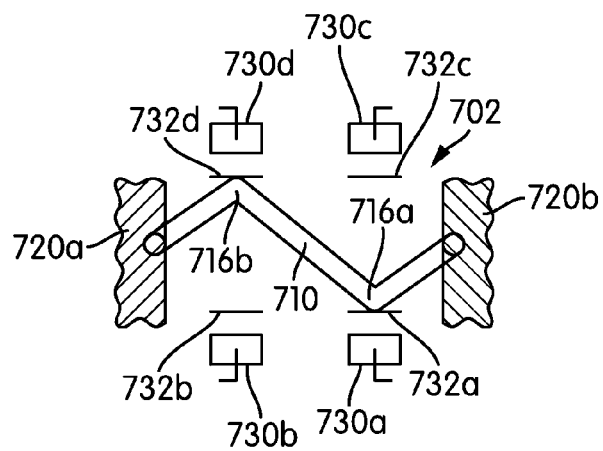

Referring to FIGS. 9A-9C, a device 702 includes a nanotube 710 supported between a first support structure 720a and a second support structure 720b to form a bridge. A plurality of contacts 732 are spaced along the length of the bridge. The device 702 includes a plurality of actuators 730, each configured to exert a force on the nanotube 710. As shown, the device 702 is configured such that the actuators cause the nanotube 710 to buckle in one or more locations, which causes the deflected nanotube to assume a variety of shapes (e.g., saw-tooth, canoe, zigzag, etc.). The nanotube 710 may then be forced to couple to one or more desired contacts 732. As described above, with respect to FIG. 2A, an actuator 730 may be configured to push or to pull the nanotube 710.

Referring specifically to FIG. 9A, the device 702 includes a first actuator 730a configured to exert a first force on the nanotube 710 such that the nanotube 710 buckles at a first buckling location 718a. Accordingly, the nanotube 710 assumes a saw-tooth shape facing right, and a first portion 716a of the nanotube 710 couples to a first contact 732a. The device 702 further includes a second actuator 730b configured to exert a second force on the nanotube 710 such that the nanotube 710 buckles at a second buckling location 718b (shown in dashed lines). In response, the nanotube 710 assumes a saw-tooth shape facing left, and a second portion 716b of the nanotube 710 couples to a second contact 732b.

Referring to FIGS. 9B and 9C, the device 702 may be configured such that two or more actuators 730 may exert forces upon the nanotube 710. As shown in FIG. 9B, a first actuator 730a and a second actuator 730b may both exert attractive forces on the nanotube 710 such that the nanotube 710 deflects to couple to the first and second contacts 732a, 732b. As shown, the nanotube 710 may buckle and one or more locations to form a canoe shape. As shown in FIG. 9C, the first actuator 730a and a third actuator 730d may both exert attractive forces on the nanotube 710 such that the nanotube 710 deflects to couple to the first and third contacts 732a, 732d. As shown, the nanotube 710 may buckle and one or more locations to form a zigzag shape. According to the exemplary embodiment shown, the first and second contacts 732a, 732b are disposed along a first line which extends substantially parallel to the nanotube 710, and the third and fourth contacts 732c, 732d are disposed along a second line which extends substantially parallel to the nanotube 710, the first line and the second line being spaced apart from one another. According to another embodiment, the first actuator 730 may apply an attractive force in a first direction, and the second actuator 730b may apply a repulsive force in a second direction causing a rotational force a third direction which may result in the nanotube 710 contacting the third contact 732d as illustrated in FIG. 9C.

Figure 10:
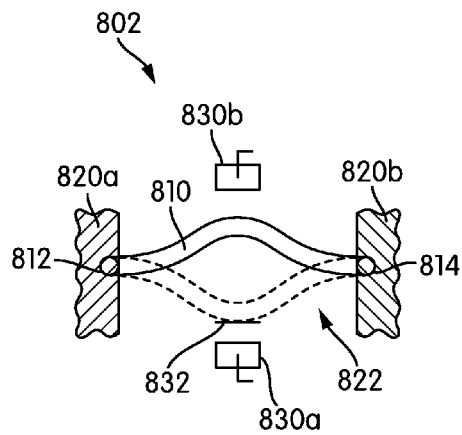
FIG. 10 is a schematic diagram of a nanoelectromechanical device, shown according to another embodiment.

Referring to FIG. 10, a device 802 includes a nanotube 810 that is pre-buckled, for example, by compressive stresses exerted by a first support structure 820a and a second support structure 820b. As shown, the nanotube 810 is supported at a first end 812 by a first support structure 820a and is supported at a second end 814 by a second support structure 820b. The nanotube 810 is supported to form a bridge, for example, over a trench 822. A first actuator 830a is configured to exert a force upon the nanotube 810 such that the buckle in the nanotube 810 changes orientation or direction (e.g., pops, re-buckles, etc.). When the buckle changes orientation, the portion of the nanotube 810 couples to a contact 832. According to an exemplary embodiment, the nanotube 810 is configured such that when the buckle changes orientation, the orientation of the buckle remains until another force is exerted upon the nanotube 810, for example by a second actuator 830b. Accordingly, the nanotube 810 would remain coupled to the contact 832 after the force exerted by the first contact 830a is removed. This technique may be usable in forming a non-volatile memory. Further, when used in conjunction with the device as described above, a multistate, nonvolatile memory may be formed.

Figure 11:
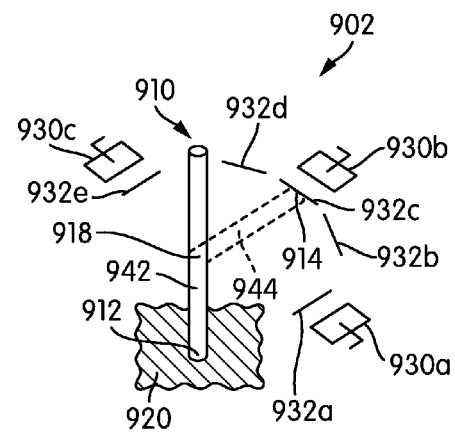
FIG. 11 is a perspective view schematic diagram of a nanoelectromechanical device, shown according to another embodiment.
Figure 12:
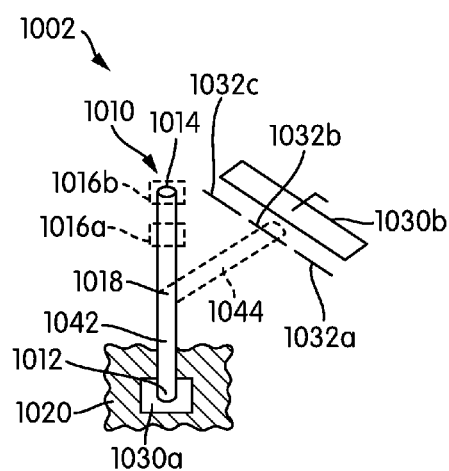
FIG. 12 is a perspective view schematic diagram of a nanoelectromechanical device, shown according to another embodiment.
Figure 13:
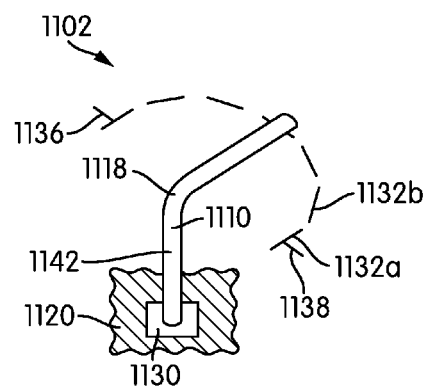
FIG. 13 is a perspective view schematic diagram of a nanoelectromechanical device, shown according to another embodiment.

Referring to FIGS. 11-13, various nanoelectromechanical devices 902, 1002, and 1102 are shown according to exemplary embodiments. The devices are shown to include a plurality of actuators 930, 1030, 1130 and a plurality of contacts 932, 1032, 1132. The devices are configured such that at least one actuator deflects or rotates a nanotube 910, 1010, 1110 in one axis and to align it with a desired contact. According to one embodiment, the nanotube 910, 1010 is configured to deflect in a first direction from the axis, and at least one actuator 930, 1030 is configured to align the first direction with one of the plurality of contacts 932, 1032. According to another embodiment, the nanotube 910, 1010, 1110 comprises a portion (e.g., 106) configured to couple to one of the plurality of contacts 932, 1032, 1132, and at least one actuator 930, 1030, 1130 is configured to align the first portion with one of the plurality of contacts 932, 1032, 1132, for example, such that when a second actuator deflects the nanotube 910, 1010, the portion couples to one of the plurality of contacts 932, 1032, 1132. According to another embodiment, the nanotube 910, 1010 comprises a buckling location 918, 1018 between the first end 912, 1012 and the second end 914, 1014, and at least one actuator 930, 1030 is configured to align the buckling location 918, 1018 with one of the plurality of contacts 932, 1032, 1132. At least one actuator 932, 1032 may deflect the nanotube in an orthogonal direction to couple the nanotube to the desired contact.

According to various embodiments, the nanotube may be buckled prior to rotation, the nanotube may be rotated and then buckled, or the nanotube may be permanently buckled. The actuators may be configured to apply attractive, repulsive, or rotative forces to the nanotube. The devices 902, 1002, 1102 may be configured such that two or more actuators jointly exert forces upon the nanotube such that the nanotube deflects in the direction of a resultant force, wherein the resultant force is a function of the ratio of forces acting upon the nanotube. According to various embodiments, the devices 102, 202, 302, and 402 may be configured such that the nanotube remains coupled to a contact by stiction after the forces that caused the coupling have been removed or may be configured such that the nanotube remains buckled, and therefore coupled to the contact, until another force is applied to the nanotube to return it to its un-buckled state. According to one embodiment, the device 902, 1002, 1102 may be configured such that buckling the nanotube decouples the nanotube from a contact (i.e., breaks the contact) rather than couples the nanotube to the contact. Briefly referring to FIGS. 7-10, it is further contemplated that the devices 902, 1002, 1102 may be configured as bridge nanotubes rather than cantilevered nanotubes as shown Referring to FIG. 11, the device 902 is shown to include a nanotube 910 having a first end 912 coupled to a support structure 920, a second end 914 disposed opposite the first end 912, and a buckling location 918 located between the first end 912 and the second end 914. A first segment 942 of the nanotube 910 extends from the first end 912 to the buckling location 918, and a second segment 944 extends from the buckling location 918 to the second end 914. The device 902 includes a plurality of actuators 930, shown as first through third actuators 930a-930c, and a plurality of contacts 932, shown as first through fifth contacts 932a-932e. The plurality of contacts 932 are shown to be substantially circumferentially oriented around the nanotube 910. In operation, one of the actuators 930 may exert a force upon the nanotube 910 causing the nanotube 910 to buckle (shown in dashed lines). As shown, the second actuator 930b causes the nanotube 910 to buckle in a first direction and to buckle to a substantially right angle. Another actuator 930, for example first actuator 930a, may then exert a second force upon the nanotube 910 such that the nanotube 910 rotates to couple to the second contact 932b or the first contact 932a, depending on the ratio forces between the first and second actuators 930. As the nanotube 910 rotates, the first segment 942 may act as a torsional spring, thereby storing mechanical energy as the nanotube 910 is rotated about the axis of the first segment 942. According to various embodiments, the nanotube 910 first buckles towards one of the other actuators 930 and then rotates to another contact 932, for example, based on the closeness of the actuator 930 to the desired contact 932. This technique may induce lower rotational stresses on the nanotube 910; however, this technique may require a more complicated control system. According to another embodiment, two or more actuators may jointly exert forces upon the nanotube 910 such that the nanotube 910 directly buckles towards the desired contact 932. For example, the first actuator 930a and the second actuator 930b may both exert forces upon the nanotube 910 such that the nanotube 910 buckles towards the second contact 932b.

Referring to FIG. 12, the device 1002 includes a first actuator 1030a configured to exert a first force on the nanotube 1010 causing the nanotube 1010 to rotate about a first axis and a second actuator 1030b configured to exert a second force on the nanotube 1010 that causes the nanotube 1010 to buckle. The device 1002 further includes a plurality of contacts 1032, shown as first through third contacts 1032a-1032c. In operation, the first actuator 1030a rotates the nanotube 1010 to align the nanotube 1010 with the desired contact 1032, and then the second actuator 1030b causes the nanotube 1010 to buckle such that a portion 1016 of the nanotube 1010 couples to the desired contact 1032. As shown, a first portion 1016a of the nanotube 1010 disposed between the buckling location 1018 and the second end 1014 of the nanotube 1010 couples to the second actuator 1032b. According to other embodiments, one or more of the contacts 1032 may be located closer or further from the axis of rotation of the nanotube 1010 axis of rotation such that when the nanotube 1010 buckles, a second portion 1016b of the nanotube 1010 couples to the selected contact 1032. According to the exemplary embodiment shown, the plurality of contacts 1032 are arranged in a substantially linear manner, such that the portion 1016 of the nanotube 1010 that couples to a desired contact 1032 depends on the angle of rotation of the nanotube 1010 and the distance of the contact 1032 from the axis of rotation. For example, the nanotube 1010 may rotate towards the first contact 1032a, and then buckle such that a second portion 1016b of the nanotube 1010 disposed proximate the second end 1014 of the nanotube 1010 couples to the first contact 1032a.

Referring to FIG. 13, the device 1102 is shown to include a nanotube 1110 supported by a structure 1120. The device 1102 is further shown to include a plurality of contacts 1132 that form a substantially continuous resistive element 1134 having a first output 1136 (e.g., connector, connection, contact, input, etc.) and an actuator 1130 configured to apply a force to the nanotube 1110 causing the nanotube 1110 to rotate about the axis extending from the support structure 1120 to a buckling location 1118. According to one embodiment, the resistance between the nanotube 1110 and the first output 1136 varies depending on where the nanotube 1110 couples to the resistive element 1134. For example, the resistance between the nanotube 1110 and the output 1136 may be a function of how the nanotube 1110 is aligned relative to the resistive element 1134. In such an embodiment, the device 1102 may act as a variable resistor. According to another embodiment, the resistive element 1134 may have a second output 1138 (e.g., connector, contact, connection, input, etc.), and a voltage may be applied across the resistive element 1134 between the first output 1136 and the second output 1138. When the nanotube 1110 couples to one of the plurality of contacts 1132, the nanotube 1110 divides the voltage across the resistive element where the nanotube 1110 couples to the resistive element 1134. For example, how the voltages are divided across the resistive element 1134 may depend on how the nanotube 1110 is aligned relative to the resistive element 1134. In such an embodiment, the device 1102 may act as an adjustable voltage divider. According to the embodiment shown, the nanotube 1110 is permanently buckled at the buckling location 1118.

Figure 14A:
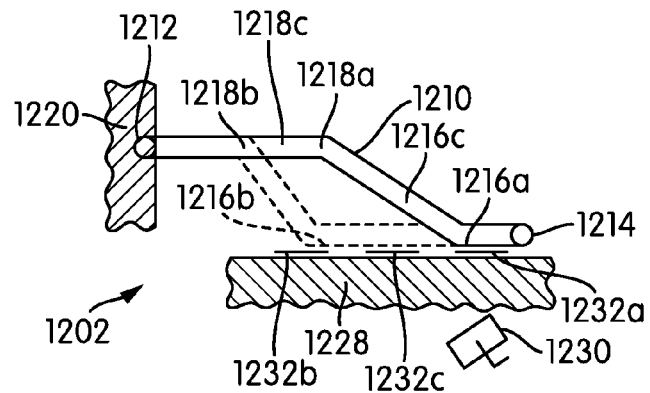
FIGS. 14A-14B are schematic diagrams of a nanoelectromechanical device, shown according to various embodiments.
Figure 14B:
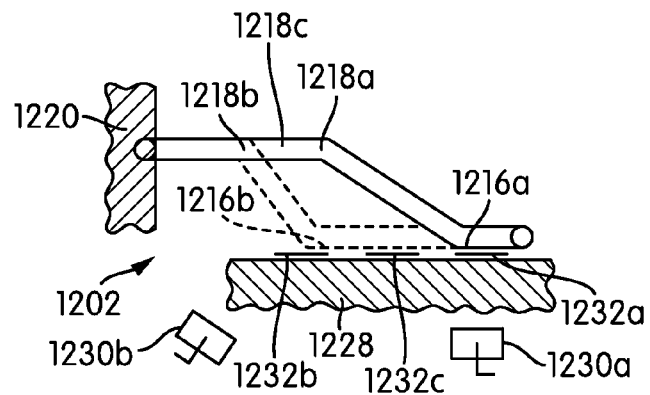

Referring to FIGS. 14A and 14B, a nanoelectromechanical device 1202 is shown according to an exemplary embodiment. The device 1202 includes a plurality of contacts 1232, shown as first through third contacts 1232a-1232c, spaced along the length of a surface 1228 and at least one variable actuator 1230 configured to deflect the nanotube 1210 into contact with the surface 1228 along a variable length thereby making 0, 1, 2 . . . n connections. The nanotube 1210 is supported at a first end 1212 by a first support structure 1220. As shown in the embodiment of FIG. 14A, the actuator 1230 is configured to apply a variable force on the nanotube 1210, thereby causing the nanotube 1210 to couple to the surface 1228. A low force is shown to cause the nanotube 1210 to buckle at a first buckling location 1218a and to couple to a first contact 1232a. A high force (shown in dashed lines) causes the nanotube 1210 to buckle at a second buckling location 1218b and to also couple to a second contact 1232b. The variable force may be controlled, for example, by adjusting the frequency or amplitude of the signal sent to the actuator 1230. The device 1202 may include additional contacts 1232 (e.g., third contact 1232c), and the nanotube 1210 may include additional buckling locations (e.g., third buckling location 1218c). Accordingly, where the nanotube 1210 buckles to what contacts 1232 the nanotube 1210 couples to may be determined based on the variable force generated by the actuator 1230. According to another embodiment, the contacts 1232 may be positioned on the surface 1228 such that a low force from the actuator 1230 causes the nanotube 1210 to couple to the surface 1228 without coupling to one of the plurality of contacts 1232. Referring to the embodiment of FIG. 14B, a first actuator 1230a may be configured to draw the nanotube 1210 into contact with the surface 1228, and a second actuator 1230b may exert a variable force on the nanotube 1210, thereby causing the nanotube 1210 to couple to the desired number of contacts 1232. Briefly referring to FIGS. 9A-9C, other embodiments of device 1202 may include a second support structure configured to support the second end 1214 of the nanotube 1210 such that the nanotube 1210 forms a bridge.

Figure 15A:
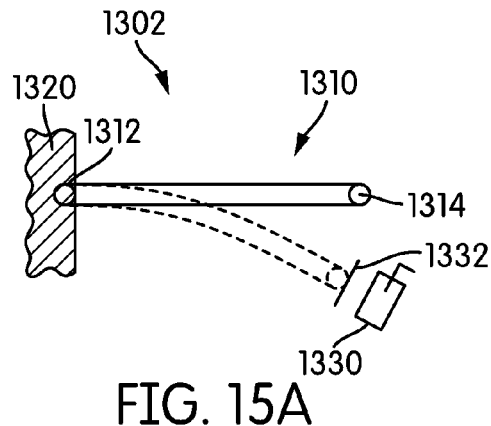
FIGS. 15A-15B are schematic diagrams of a memory device, shown according to an exemplary embodiment.
Figure 15B:
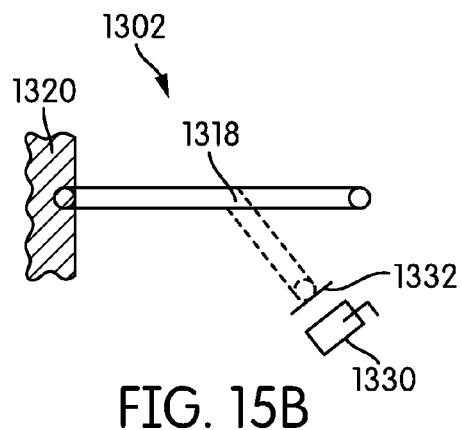
Figure 16:
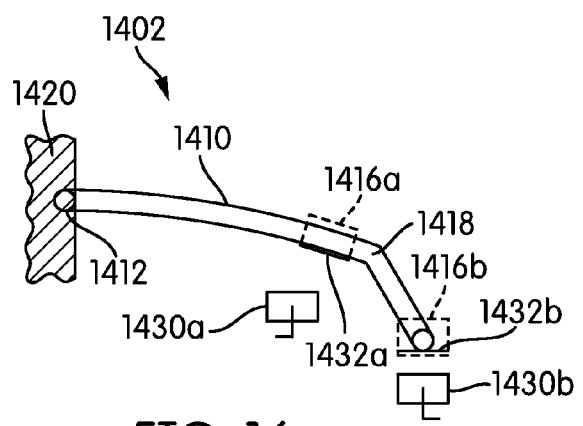
FIG. 16 is a schematic diagram of a memory device, shown according to another embodiment.

Referring to FIGS. 15 and 16, memory devices 1302, 1402 are shown according to exemplary embodiments. The memory devices 1302, 1402 are shown to include a nanotube 1310, 1410 supported at a first end 1312, 1412 by support structure 1320, 1420. Memory devices include a first memory state, a second memory state in which the nanotube is elastically deformed, and a third memory state in which the nanotube is buckled. According to various embodiments, the third memory state may be reversible or irreversible, erasable or permanent. For example, the buckling deformation of the nanotube may be such that the nanotube returns to an unbuckled state when the buckling force is removed. In other examples, the nanotube may be forced back into the first or second state by applying another force (e.g., a repulsive electrostatic force, an attractive force from another actuator, a chemical bath, heating, etc.) to the nanotube. In yet other examples, the energy state of the nanotube structure may be sufficiently decreased during buckling that the nanotube structure cannot be unbuckled. According to one embodiment, the device may be configured such that the second memory state behaves as a random access memory (RAM) and the third memory state behaves as a read-only memory (ROM). In the ROM configuration, the nanotube may be configured such that is retained against the contact by stiction or by the nature of the buckle in the nanotube. While the embodiments of FIGS. 15 and 16 are shown to be cantilevered, it is contemplated that the memory devices may be configured such that the nanotube is a bridge supported at both ends.

Referring specifically to FIG. 15A, the first state (shown in solid lines) is shown to be an off state in which the nanotube is not coupled to a contact 1332. Further, when the nanotube 1310 is in the first memory state the nanotube 1310 is not deflected. As shown, actuator 1330 (e.g., a variable force actuator) is configured to exert a first (e.g., low) force on the nanotube 1310 causing the nanotube 1310 to elastically deform (shown in dashed lines) such that the nanotube 1310 couples to a contact 1332. Referring to FIG. 15B, the actuator 1330 may further be configured to apply a second force (e.g., high) force on the nanotube 1310 causing the nanotube 1310 to buckle (shown in dashed lines) such that the nanotube 1310 couples to the contact 1332. According to one embodiment, the first force is less than the second force.

Referring to FIG. 16, the device 1402 is shown to include a first contact 1432a, a second contact 1432b, a first actuator 1430a, and a second actuator 1430b. The device 1402 is configured such that the first actuator 1430a exerts a first force on the nanotube 1410 so as to cause the nanotube 1410 to elastically deform such that a first portion 1416a of the nanotube 1410 couples to the first contact 1432a. The second actuator 1430b exerts the second force on the nanotube 1410 such that the nanotube 1410 buckles at a buckling location 1418, and a second portion 1416b of the nanotube 1410 couples to the second contact 1432b.

Figure 17:
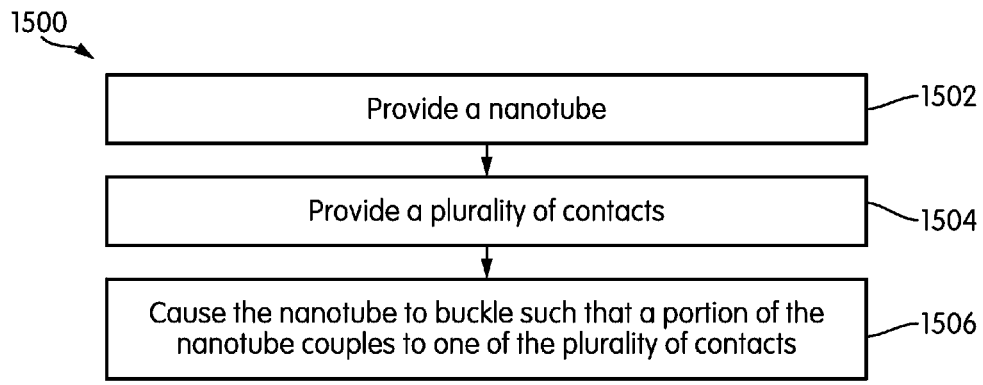
FIG. 17 is a flowchart of a process for closing an electrical circuit, shown according to an exemplary embodiment.

Referring to FIG. 17, a flowchart of a process 1500 for closing an electric circuit is shown, according to an exemplary embodiment. Process 1500 is shown to include the steps of providing a nanotube (step 1502), providing a plurality of contacts (step 1504), and causing the nanotube to buckle such that a portion of the nanotube couples to one of the plurality of contacts (step 1506).

Figure 18:
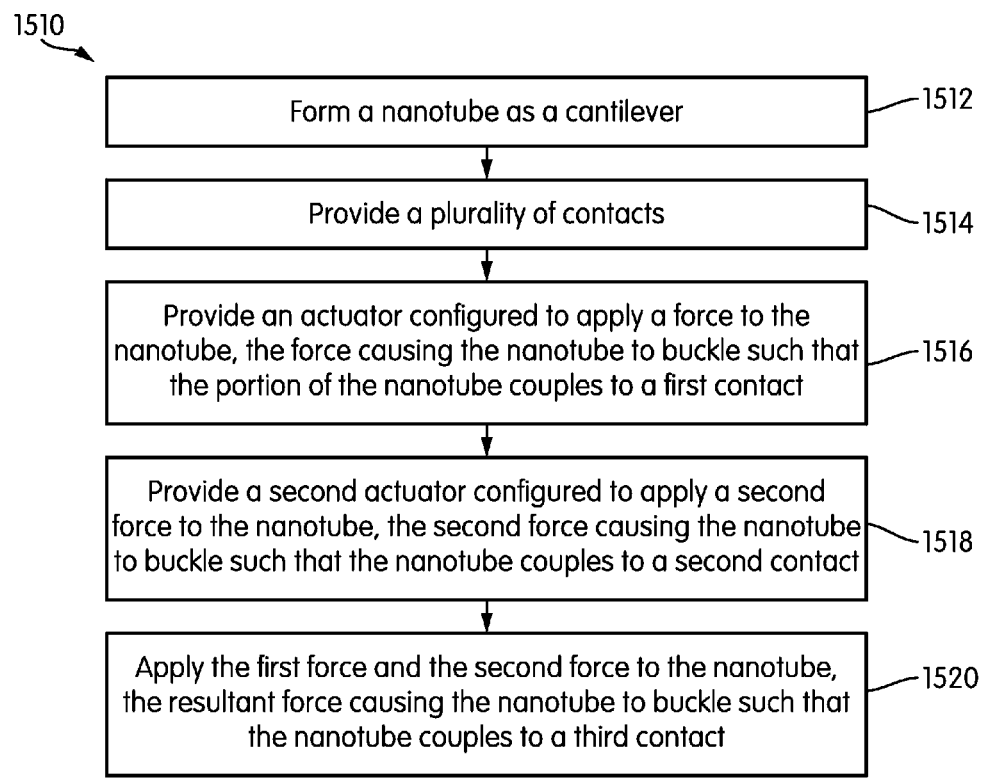
FIG. 18 is a flowchart of a process for closing an electrical circuit, shown according to another embodiment.

Referring to FIG. 18, a flowchart of a process 1510 for closing electric circuit is shown, according to an exemplary embodiment. Process 1510 is shown to include the steps of forming the nanotube as a cantilever (step 1512), providing a plurality of contacts (step 1514), providing an actuator configured to apply a force to the nanotube, the force causing the nanotube to buckle such that the portion that nanotube couples to a first contact (step 1516), providing a second actuator configured to apply a second force to the nanotube, the second force causing the nanotube to buckle such that the nanotube couples to a second contact (step 1518), and applying the first force and the second force to the nanotube, the resultant force causing the nanotube to buckle such that nanotube couples to a third contact (step 1520).

Figure 19:
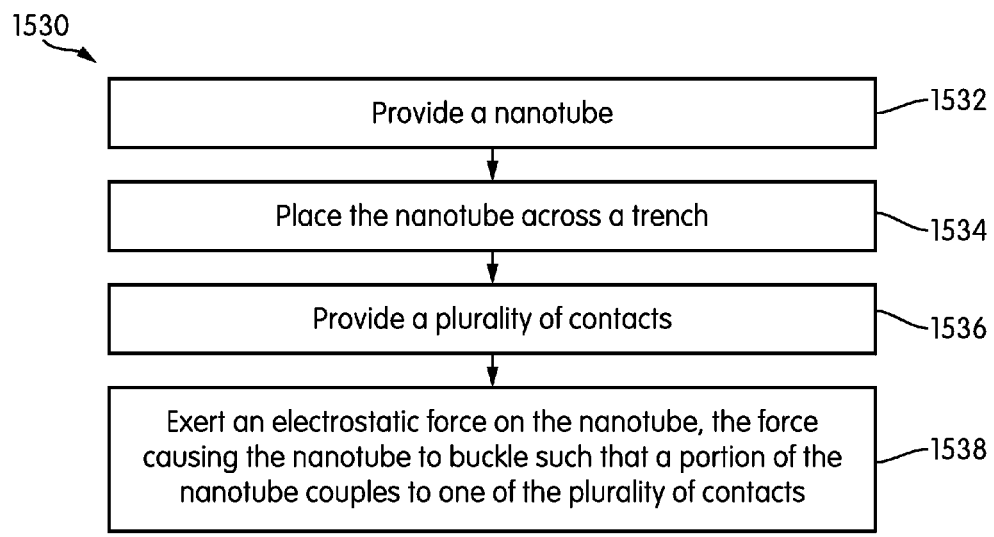
FIG. 19 is a flowchart of a process for closing an electrical circuit, shown according to another embodiment.

Referring to FIG. 19, a flowchart of a process 1530 for closing electric circuit is shown, according to an exemplary embodiment. Process 1530 is shown to include the steps of providing a nanotube (step 1532), disposing the nanotube across a trench (step 1534), providing a plurality of contacts (step 1536) and exerting a electrostatic force on the nanotube, the force causing the nanotube to buckle such that a portion of the nanotube couples to one of the plurality of contacts (step 1538).

The construction and arrangement of the devices and methods as shown in the exemplary embodiments are illustrative only. Although only a few embodiments have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and assemblies may be constructed from any of a wide variety of materials that provide sufficient strength or durability, in any of a wide variety of colors, textures, and combinations. Additionally, in the subject description, the word "exemplary" is used to mean serving as an example, instance or illustration. Any embodiment or design described herein as "exemplary" is not necessarily to be construed as preferred or advantageous over other embodiments or designs. Rather, use of the word exemplary is intended to present concepts in a concrete manner. Accordingly, all such modifications are intended to be included within the scope of the present inventions. Other substitutions, modifications, changes, and omissions may be made in the design, operating conditions, and arrangement of the preferred and other exemplary embodiments without departing from the scope of the appended claims.

The order or sequence of any process or method steps may be varied or re-sequenced according to alternative embodiments. Also, two or more steps may be performed concurrently or with partial concurrence. Other substitutions, modifications, changes and omissions may be made in the design, operating configuration, and arrangement of the preferred and other exemplary embodiments without departing from the scope of the appended claims.

What is claimed is:

1. A nanoelectromechanical device, comprising:
   a nanotube comprising:
      a first end, the first end supported by a first structure;
      a second end opposite the first end; and
      a first portion;
   a first contact; and
   a first actuator configured to rotate the nanotube to align the nanotube with the first contact and to apply a force to the nanotube, the force causing the nanotube to buckle such that the first portion couples to the first contact.

2. The device of claim 1, wherein the first portion is disposed proximate the second end.

3. The device of claim 1, wherein the first portion is spaced apart from the first end and the second end.

4. The device of claim 1, wherein the force is an electrostatic force.

5. The device of claim 1, wherein the nanotube is cantilevered from the first structure.

6. The device of claim 1, wherein the second end is supported by a second structure.

7. A nanoelectromechanical device, comprising:
   a nanotube comprising:
      a first end, the first end supported by a first structure;
      a second end opposite the first end; and
      a first portion;
   a plurality of contacts comprising a first contact and a second contact;
   a first electrode configured to apply a first force to the nanotube, the first force acting in a first direction; and
   a second electrode configured to apply a second force to the nanotube, the second force acting in a second direction;
   wherein the first portion is configured to couple to one of the plurality of contacts depending on the ratio of the first force and the second force applied to the nanotube.

8. The device of claim 7, wherein the first contact is disposed in a third direction from the nanotube.

9. The device of claim 7, wherein the first force and the second force cause a resultant force on the nanotube, the resultant force acting in a third direction.

10. The device of claim 7, wherein the plurality of contacts further comprises a third contact, and wherein the first portion is configured to couple to one of the plurality of contacts depending on the ratio of the first force and the second force applied to the nanotube.

11. The device of claim 7 further comprising a third electrode configured to apply a third force to the nanotube, the third force acting in a third direction.

12. The device of claim 7, wherein the first force and the second force are electrostatic forces.

13. The device of claim 7, wherein the nanotube comprises a second portion, and wherein the nanotube is configured to couple to the first contact at the first portion and to the second contact at the second portion.

14. The device of claim 7, wherein the nanotube is cantilevered from the first structure.

15. The device of claim 7, wherein the second end is supported by a second structure.

16. The device of claim 7, wherein when the nanotube is in a first position, the nanotube extends in an axial direction, and wherein the plurality of contacts are located in a plurality of radial directions from the nanotube.

17. The device of claim 16, wherein the plurality of electrodes are located in a second plurality of radial directions from the nanotube.

18. The device of claim 7, wherein when the nanotube is in a first position, the nanotube extends in a first radial direction from the point at which the nanotube is supported by the first structure, and wherein the plurality of contacts are located in a plurality of radial directions from the point at which the nanotube is supported by the first structure.

19. The device of claim 18, wherein the plurality of contacts are located in a plane.

20. The device of claim 18, wherein the first electrode and the second electrode are located coplanar to the plurality of contacts, the first electrode is located along a first secant that is substantially perpendicular to the first radial direction, and the second electrode is located along a second secant that is substantially perpendicular to the first radial direction.

21. A nanoelectromechanical device, comprising:
   a nanotube extending from a first structure along an axis, the nanotube comprising:
      a first end supported by the first structure; and
      a second end opposite the first end;
   a plurality of contacts comprising a first contact and a second contact; a first actuator configured to rotate the nanotube about the axis and to align the nanotube with one of the plurality of contacts; and
   a second actuator configured to deflect the nanotube such that the nanotube couples to the one of the plurality of contacts.

22. The device of claim 21, wherein the second actuator is configured to buckle the nanotube.

23. The device of claim 21, wherein the device is configured to rotate the nanotube and then to deflect the nanotube.

24. The device of claim 21, wherein the device is configured to deflect the nanotube and then to rotate the nanotube.

25. A nanoelectromechanical device, comprising:
   a nanotube comprising:
      a first end supported by a first structure;
      a second end opposite the first end;
      a buckling location located between the first end and the second end;
      a first segment extending from the first end to the buckling location along a first axis; and
      a second segment extending from the buckling location to the second end;
   a plurality of contacts comprising a first contact and a second contact; and a first actuator configured to rotate the nanotube about the axis and to align the nanotube with one of the plurality of contacts.

26. The device of claim 25, wherein the nanotube is permanently buckled.

27. The device of claim 25, wherein the first segment and the second segment form a substantially right angle.

28. The device of claim 25, wherein the plurality of contacts are located substantially circumferentially about the axis.

29. The device of claim 25, wherein the nanotube is cantilevered from the first structure.

30. The device of claim 25, wherein the second end is supported by a second structure.

31. The device of claim 25, wherein the first segment is configured to store mechanical energy as the nanotube is rotated about the first axis.

32. The device of claim 25, wherein the plurality of contacts form a substantially continuous resistive element having a voltage applied thereacross, and wherein when the nanotube couples to one of the plurality of contacts, the nanotube divides the voltage across the resistance element depending on where the first actuator aligns the nanotube with respect to the resistive element.

33. The device of claim 25, wherein the plurality of contacts form a substantially continuous resistive element having an end, and wherein when the resistance between the nanotube and the output varies depending on where the first actuator aligns the nanotube with respect to the resistive element.

34. The device of claim 25, wherein the nanotube comprises a first portion configured to couple to one of the plurality of contacts, and wherein the first actuator is configured to align the first portion with one of the plurality of contacts.

* * * * *